United States Patent
Funaki et al.

[11] Patent Number: 5,907,129
[45] Date of Patent: May 25, 1999

[54] SYNDIOTACTIC STYRENIC RESIN COMPOSITION

[75] Inventors: Keisuke Funaki; Takaaki Uchida; Akitoshi Masuyama, all of Ichihara, Japan

[73] Assignee: Idemitsu Kosan Co., Ltd., Tokyo, Japan

[21] Appl. No.: 08/738,653

[22] Filed: Oct. 30, 1996

Related U.S. Application Data

[63] Continuation of application No. 08/481,390, filed as application No. PCT/JP94/01940, Nov. 17, 1994, abandoned.

[30] Foreign Application Priority Data

Nov. 19, 1993 [JP] Japan ................................ 5-290440

[51] Int. Cl.$^6$ ........................................ H01B 7/00
[52] U.S. Cl. ..................... 174/110; 524/100; 524/218; 524/222; 524/255; 524/257; 524/258; 524/291
[58] Field of Search ..................... 524/100, 218, 524/222, 255, 258, 291, 257; 174/110; 264/331.17; 428/694 SL

[56] References Cited

U.S. PATENT DOCUMENTS

| | | | |
|---|---|---|---|
| 3,245,992 | 4/1966 | Dexter et al. | 524/100 |
| 3,505,225 | 4/1970 | Wheeler | 524/258 |
| 3,584,047 | 6/1971 | Dexter et al. | 524/222 |
| 3,649,542 | 3/1972 | Haseke et al. | 174/110 |
| 3,806,358 | 4/1974 | Glander | 524/222 |
| 3,849,492 | 11/1974 | Brunetti et al. | 524/194 |
| 3,956,420 | 5/1976 | Kato et al. | 174/110 |
| 4,044,200 | 8/1977 | Turbet | 524/194 |
| 4,093,774 | 6/1978 | Hartless et al. | 428/379 |
| 4,140,818 | 2/1979 | Davé | 174/110 |
| 4,959,435 | 9/1990 | Seitz et al. | 526/347.2 |
| 4,985,481 | 1/1991 | Neri et al. | 524/222 |
| 5,034,441 | 7/1991 | Nakano et al. | 524/117 |
| 5,109,068 | 4/1992 | Yamasaki et al. | 524/371 |
| 5,145,950 | 9/1992 | Funaki et al. | 264/331.17 |
| 5,155,151 | 10/1992 | Hashimoto et al. | 524/106 |
| 5,166,238 | 11/1992 | Nakano et al. | 524/151 |
| 5,210,118 | 5/1993 | Scrima | 524/106 |
| 5,250,629 | 10/1993 | Tani et al. | 526/347 |
| 5,357,014 | 10/1994 | Uchida et al. | 526/347.2 |

FOREIGN PATENT DOCUMENTS

| | | |
|---|---|---|
| 0 382 064 | 8/1990 | European Pat. Off. . |
| 51-16350 | 2/1976 | Japan . |
| 52-45643 | 4/1977 | Japan . |
| 2-202939 | 8/1990 | Japan . |
| 2-219843 | 9/1990 | Japan . |
| 3-124750 | 5/1991 | Japan . |

OTHER PUBLICATIONS

Abstract of Japanese Patent No. 07 138 433.

*Primary Examiner*—Veronica P. Hoke
*Attorney, Agent, or Firm*—Oblon, Spivak, McClelland, Maier & Neustadt, P.C.

[57] ABSTRACT

There is disclosed a styrenic resin composition which comprises 70 to 99.9% by weight of an (A) styrenic polymer having a high degree of syndiotactic configuration and 0.1 to 30% by weight of a (B) organic compound having a —NH— group and a molecular weight of less than 10,000.

According to the present invention, there is obtained a styrenic resin composition having a syndiotactic configuration which is improved in electrical insulating properties, especially in withstand voltage against direct current.

11 Claims, No Drawings

5,907,129

SYNDIOTACTIC STYRENIC RESIN COMPOSITION

This application is a Continuation of application Ser. No. 08/481,390, filed on Jul. 17, 1995, now abandoned, which was filed as International Application No. PCT/JP94/01940 on Nov. 17, 1994.

TECHNICAL FIELD

The present invention relates to a styrenic resin composition. More particularly, it pertains to a styrenic resin composition which comprises a styrenic polymer having a high degree of syndiotactic configuration.

BACKGROUND ART

A styrenic polymer having a high degree of syndiotactic configuration is excellent in heat resistance, solvent resistance and electrical characteristics and accordingly, is expected to find a variety of use especially as a favorable raw material for use in the field of electrical insulation such as electronic machinery parts, printed circuit board, insulating self-adhesive tape and capacitor.

However, conventional styrenic polymers having a syndiotactic configuration sometimes fail to exert sufficient withstand voltage, for example, when molded into a thin film or the like, and thus further improvement in withstand voltage is desired for such styrenic polymers. As a method of improving the withstand voltage of such styrenic polymers having a syndiotactic configuration, there is proposed for example, in Japanese Patent Application Laid-Open No. 124750/1991, a method of decreasing residual catalyst and residual monomers in the resultant polymer. Although some improvement in dielectric breakdown voltage of the styrenic polymers is observed to a practicable extent according to the above-mentioned method, the method has involved the problem that its availability is limited in use requiring a high withstand voltage to direct current such as a printed circuit board and a capacitor. There is also proposed a composition containing a styrenic polymer having a syndiotactic configuration incorporated with a phosphorus-based antioxidant, phenol-based antioxidant, sulfur-based antioxidant or the like, but improvement in withstand voltage according to the aforesaid composition has still been insufficient.

In addition, it is reported that the withstand voltage of polyethylene, etc. is improved by the addition of a polycyclic aromatic compound such as pyrene, but the addition thereof to a styrenic polymer having a syndiotactic configuration can not attain such effect. Likewise, any of a method wherein a crosslinked polyethylene is employed, a method wherein a fine-grained crystalline structure is employed and a method in which crystallinity is improved each being known as a method of improving the dielectric breakdown voltage of polyethylene and the like is difficult to apply to a styrenic polymer having a syndiotactic configuration because of difference between the two with regard to the behavior in crystallization, crystalline structure, processing method and processing conditions.

DISCLOSURE OF THE INVENTION

The present invention has been made in the light of the above-mentioned circumstances. As a result of intensive research and investigation made by the present inventors, it has been found that, as a means for improving the withstand voltage properties of a styrenic polymer having a syndiotactic configuration, it is effective to add a low-molecular organic compound having a specific structure to such styrenic polymer. The present invention has been accomplished on the basis of the above-mentioned finding and information.

Specifically, the present invention provides a styrenic resin composition which comprises 70 to 99.9% by weight of an (A) styrenic polymer having a high degree of syndiotactic configuration and 0.1 to 30% by weight of a (B) organic compound having a —NH— group and a molecular weight of less than 10,000.

THE MOST PREFERRED EMBODIMENT TO CARRY OUT THE INVENTION

The present invention will be described in more detail in the following.

The styrenic polymer having a syndiotactic configuration in the present invention means that its stereochemical structure is of syndiotactic configuration, i.e. the stereostructure in which phenyl groups or substituted phenyl groups as side chains are located alternately at opposite directions relative to the main chain consisting of carbon-carbon bonds. Tacticity is quantitatively determined by the nuclear magnetic resonance method ($^{13}$C-NMR method) using carbon isotope. The tacticity as determined by the $^{13}$C-NMR method can be indicated in terms of proportions of plural structural units continuously connected to each other, i.e., a diad in which two structural units are connected to each other, a triad in which three structural units are connected to each other and a pentad in which five structural units are connected to each other. "The styrenic polymers having a high degree of syndiotactic configuration" as mentioned in the present invention usually means polystyrene, poly(alkylstyrene), poly(halogenated styrene), poly(alkoxystyrene), poly(vinyl benzoate), hydrogenated polymer thereof, the mixture thereof, and copolymers containing the above polymers as main components, having such a syndiotacticity as determined by the above-mentioned method that the proportion of racemic diad is at least 75%, preferably at least 85%, or the proportion of racemic pentad is at least 30%, preferably at least 50%. Examples of the poly(alkylstyrene) include poly(methylstyrene), poly(ethylstyrene), poly(propylstyrene), poly(butylstyrene), poly(phenylstyrene), poly(vinylnaphthalene), poly(vinylstyrene) and poly(acenaphthylene). Examples of the poly(halogenated styrene) include poly(chlorostyrene), poly(bromostyrene) and poly(fluorostyrene). Examples of the poly(alkoxystyrene) include poly(methoxystyrene), and poly(ethoxystyrene).

The particularly desirable styrenic polymers are polystyrene, poly(p-methylstyrene), poly(m-methylstyrene), poly(p-tert-butylstyrene), poly(p-chlorostyrene), poly(m-chlorostyrene), poly(p-fluorostyrene) and the copolymer of styrene and p-methylstyrene. (Refer to Japanese Patent Application Laid-Open No.187708/1987).

The comonomers in the styrenic copolymer are exemplified by the aforesaid monomer of the styrenic polymer, olefinic monomers such as ethylene, propylene, butene, hexene and octene, diolefinic monomers such as butadiene and isoprene, cyclic diolefinic monomers and polar vinyl monomers such as methyl methacrylate, maleic anhydride and acrylonitrile.

The molecular weight of the styrenic polymer to be used in the present invention is not specifically limited, but is preferably at least 10,000 and at most 3,000,000, more preferably at least 50,000 and at most 1,500,000 in terms of weight-average molecular weight. A weight-average molecular weight of less than 10,000 sometimes results in failure in sufficient orientation. The molecular-weight distribution, that is, the broadening of molecular weight of the styrenic polymer is not specifically limited as well, but may be in a wide range. It is preferable that a weight-average molecular weight (Mw)/a number-average molecular weight (Mn) ratio be at least 1.5 and at most 8. The styrenic polymer having such syndiotactic configuration is surpassingly superior to the conventional styrenic polymer having an atactic configuration in terms of heat resistance.

The styrenic polymer having the syndiotactic configuration according to the present invention is such that is described hereinbefore and is preferably highly pure with minimized contents of impurities. That is to say, the contents of aluminum components of the group IIIB compounds that are derived from the catalyst employed in the step of producing the aforesaid styrenic polymer by polymerizing a styrenic monomer are preferably 1000 ppm or less, more preferably 800 ppm or less based on the resultant styrenic polymer, and the residual amounts of the styrenic monomers are preferably 3,000 ppm or less, more preferably 2,000 ppm or less based on said styrenic polymer.

Examples of the group IIIB compounds that are derived from the catalyst in the case of usually used catalyst of a titanium compound/an aluminum compound include the aluminum compound contained in the catalyst. The styrenic monomers are starting raw monomers to be used in the polymerization and, in the case where there is used a monomer other than the styrenic monomers to obtain a copolymer, they are construed into including the residue of said monomer.

The above-mentioned styrenic polymer having a high degree of syndiotactic configuration is contained in the styrenic resin composition of the present invention in an amount of 70 to 99.9% by weight, preferably 80 to 99.9% by weight.

There are available various processes for the production of such highly pure styrenic polymer by the use of the monomer corresponding to the objective polymer, which processes are exemplified in the following. For the purpose of controlling the residual aluminum components and residual styrenic monomers, there are available a ① method in which a highly active catalyst is employed to produce the styrenic polymer (refer to Japanese Patent Application Laid-Open No.294705/1989) and a ② method by deashing and washing in which a styrenic monomer is polymerized by the use of a catalyst comprising an organometallic compound containing a group IVA metal such as an organotitanium compound and an alkylaluminoxane such as methylaluminoxane, which catalyst is described in Japanese Patent Application Laid-Open No.187708/1987 and thereafter the resultant styrenic polymer having the syndiotactic configuration is deashed with a solution of an acid or alkali in a proper solvent, followed by washing with a proper solvent.

By the method ① or ② as described hereinbefore, there is obtained a styrenic polymer having the syndiotactic configuration and minimized in residual aluminum components, which is further treated by the following method ③ or ④ to reduce the residual styrenic monomers content as low as 5,000 ppm or less. When the residual styrenic monomers content is 5,000 ppm or less in this stage, such content can be reduced as low as 3,000 ppm or less in the case where the styrenic polymer is made into a film. Method ③ in which the above-mentioned styrenic polymer is dried under reduced pressure: It is effective in drying to set a drying temperature to not lower than the glass transition temperature of the styrenic polymer. Method ④ in which the above-mentioned styrenic polymer is degassed by means of an extruder.

Through such treatments, there is obtained a styrenic polymer having the syndiotactic configuration and high purity with minimized contents of both residual aluminum components and residual styrenic monomers. It is particularly preferable from the viewpoint of electrical characteristics to regulate the content of residual compounds of a group IVA element that are derived from the catalyst, specifically of residual titanium components to 10 ppm or less, preferably 7 ppm or less; the content of halogen compounds that are incorporated in the polymer by the deashing procedure to 50 ppm or less; and the content of alkali metal compounds to 100 ppm or less.

It is preferable in the present invention that the organic compound having a —NH— group and a molecular weight of less than 10,000 be such that having an electron-attracting group adjacent to the —NH— group. It is preferable that such an electron-attracting group contains an aromatic ring such as benzene ring, naphthalene ring, anthracene ring, pyridine ring, triazine ring, indenyl ring and a derivative thereof or a carbonyl structure. The above-mentioned organic compound has preferably a thermal decomposition temperature of 260° C. or higher and is specifically exemplified, as a usable compound, by 2,4-bis(n-octylthio)-6-(4-hydroxy-3,5-di-tert-butylanilino)-1,3,5-triazine; N,N'-hexamethylenebis(3,5-di-tert-butyl-4-hydroxy-hydrocinnamide); N,N'-bis[3-(3,5-di-tert-butyl-hydroxyphenol)propionyl]hydrazine; 3-(N-salicyloyl) amino-1,2,4-triazole; disalicyloylhydrazide decamethylenedicarboxylate; 2-phenoxypropionylhydrazide isophthalate; oxalyl-bis (benzylidene-hydrazide); N-formyl-N'-salicyloylhydrazine; 2-mercaptobenzimidazole; N,N'-di-2-naphthyl-p-phenylenediamine; 4,4'-bis(α,α-dimethylbenzyl) diphenylamine; 2-mercaptomethylbenzimidazole; styrenated diphenylamine; octylated diphenylamine; N-phenyl-1-naphthylamine; poly(2,2,4-trimethyl-1,2-dihydroxyquinoline; 6-ethoxy-1,2-dihydro-2,2,4-trimethylquinoline; N,N'-diphenyl-p-phenylenediamine; N-phenyl-N'-(1,3-dimethylbutyl)-p-phenylenediamine; N-phenyl-N'-(3-methacryloxy-2-hydroxypropyl)-p-phenylenediamine; thiodiphenylamine; p-aminodiphenylamine; N-salicyloyl-N'-aldehydehydrazine; N-salicyloyl-N-acetylhydrazine; N,N'-diphenyl-oxamide; N,N'-di(2-hydroxyphenyl)oxamide; 6-ethoxy-2,2,4-trimethyl-1,2-dihydroquinoline; and N-phenyl-N'-isopropyl-p-phenylenediamine. Preferably usable compound among these are 2,4-bis(n-octylthio)-6-(4-hydroxy-3,5-di-tert-butylanilino)-1,3,5-triazine; N,N'-hexamethylenebis(3,5-di-tert-butyl-4-hydroxy-hydrocinnamide); [N,N'-bis 3-(3,5-di-tert-butyl-hydroxyphenyl)propionyl]hydrazine; 3-(N-salicyloyl) amino-1,2,4-triazole; disalicyloylhydrazide decamethylenedicarboxylate; 2-phenoxypropionylhydrazide isophthalate; oxalyl-bis (benzylidene-hydrazide); N-formyl-N'-salicyloylhydrazine; 2-mercaptobenzimidazole; N,N'-di-2-naphthyl-p-phenylenediamine; and 4,4'-bis(α,α-dimethylbenzyl) diphenylamine.

The above-mentioned organic compound having a —NH— group and a molecular weight of less than 10,000 is contained in the styrenic resin composition in an amount of 0.1 to 30% by weight, preferably 0.1 to 20% by weight, more preferably 0.1 to 10% by weight. An amount thereof less than 0.1% by weight results in failure to attain the effect on the improvement in the withstand voltage, whereas an amount thereof more than 30% by weight brings about difficulty in molding as well as insufficiency in dynamic properties and heat resistance of the molded article to be produced from the composition.

The styrenic resin composition according to the present invention may further be incorporated with a lubricant, other thermoplastic resin, an antioxidant, an inorganic filler such as glass fiber, rubber, a compatibilizing agent, a colorant, a flame retardant, a crosslinking agent, a crosslinking aid, a nucleating agent, a plasticizer and the like to the extent that the object of the present invention is not impaired therby.

There is usable as the lubricant for example, an inorganic fine grain, which is represented by an oxide, a hydroxide, sulfide, nitride, halogenide, carbonate, sulfate, acetate, phosphate, phosphite, an organocarboxylate, a silicate, titanate and borate each of an element belonging to the group IA, IIA, IVA, VIA, VIIA, VIII, IB, IIB, IIIB or IVB, a hydrated compound thereof, a composite compound composed principally thereof, and natural mineral particles.

Specific examples of the inorganic fine grains include a compound of a group IA element such as lithium fluoride and borax (sodium borate hydrate); a compound of a group IIA element such as magnesium carbonate, magnesium phosphate, magnesium oxide(magnesia), magnesium chloride, magnesium acetate, magnesium fluoride, magnesium titanate, magnesium silicate, magnesium silicate hydrate(talc), calcium carbonate, calcium phosphate, calcium phosphate, calcium sulfate(gypsum), calcium acetate, calcium terephthalate, calcium hydroxide, calcium silicate, calcium fluoride, calcium titanate, strontium titanate, barium carbonate, barium phosphate, barium sulfate and barium phosphite; a compound of a group IVA element such as titanium dioxide (titania), titanium monoxide, titanium nitride, zirconium dioxide (zirconia) and zirconium monoxide; a compound of a group VIA element such as molybdenum dioxide, molybdenum trioxide and molybdenum sulfide; a compound of a group VIIA element such as manganese chloride and manganese acetate; a compound of a group VIII element such as cobalt chloride and cobalt acetate; a compound of a group IB element such as cuprous iodide; a compound of a group IIB element such as zinc oxide and zinc acetate; a compound of a group IIIB element such as aluminum oxide (alumina), aluminum hydroxide, aluminum fluoride and aluminosilicate (alumina silicate, kaolin, kaolinite); a compound of a group IVB element such as silicon oxide (silica, silica-gel), graphite, carbon and glass; and a natural mineral such as carnallite, kernite, mica (phlogopite) and pyrolusite, each in the form of particle.

The average particle diameter of the inorganic fine grains to be used is not specifically limited, but is preferably 0.01 to 3 μm, and the content in a molded article is 0.001 to 5% by weight, preferably 0.005 to 3% by weight. The inorganic fine grains are finally contained in a molded article without any limitation to the method of incorporating the grains therein. There are available a method in which the grains are added or deposited in an optional step during the polymerization and a method in which the grains are added in an optional step during melt extrusion.

There are available a variety of other thermoplastic resins that may be added to the above-mentioned styrenic polymer in the present invention. Such resins are exemplified by a styrenic polymer having an atactic configuration, a styrenic polymer having an isotactic configuration and a polyphenylene ether. The above-exemplified resins are easily compatible with the aforestated styrenic polymer having the syndiotactic configuration, effective in controlling the crystallization at the time of preparing a preform for orientation, and thereafter enhance the orientation property of the preform, facilitate the orientation conditions and thus enable to produce a film having excellent dynamic properties. In the case where a styrenic polymer having an atactic and/or an isotactic configuration is incorporated, it is preferable that the aforesaid styrenic polymer be composed of the styrenic monomer same as that for the styrenic polymer having the syndiotactic configuration. The amount of the compatible resin components to be contained in the styrenic polymer may be 1 to 70% by weight, especially 2 to 50% by weight. An amount thereof exceeding 70% by weight unfavorably impaires, as the case may be, the heat resistance which is an advantage of a styrenic polymer having the syndiotactic configuration.

Examples of incompatible resin which can be added as other resin to the polymer according to the present invention include a polyolefin such as polyethylene, polypropylene, polybutene and polypentene; a polyester such as polethylene terephthalate, polybutylene terephthalate and polyethylene naphthalate; a polyamide such as nylon 6 and nylon 6,6; a polythioether such as polyphenylene sulfide; polycarbonate; polyarylate; polysulfone; polyetheretherketone; polyether sulfone; polyimide; a halogenated vinylic polymer such as teflon; an acrylic polymer such as poly(methyl methacrylate); poly(vinyl alcohol), that is, all resins other than the above-mentioned compatible resins; and a crosslinked resin containing the above-mentioned compatible resins. The above-exemplified resins are incompatible with the styrenic polymer having the syndiotactic configuration according to the present invention and accordingly, when contained in a small amount therein, enable themselves to be dispersed in said styrenic polymer just like islands and are effective in imparting favorable gloss to the polymer after orientation and in improving the surface slipperiness. The amount of the incompatible resin components to be contained is preferably 2 to 50% by weight for the purpose of imparting gloss, and preferably 0.001 to 5% by weight for the purpose of controlling the surface properties. It is preferable, in the case of a high working temperature as a product, to employ a relatively heat-resistant incompatible resin.

Examples of usable antioxidant include a phosphorus-based antioxidant, a phenolic antioxidant and a sulfur-based antioxidant. By the use of the ternary antioxidant, a polystyrene-based resin composition having excellent heat stability is obtained.

There are available a variety of phosphorus-based antioxidants including a monophosphite and diphosphite. Examples of the monophosphite include tris(2,4-di-tert-butylphenyl)phosphite and tris(mono/di-nonylphenyl) phosphite. The diphosphite to be used is represented by the general formula

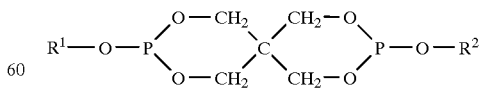

where $R^1$ and $R^2$ may be the same as or different from each other and are each an alkyl group having 1 to 20 carbon atoms, a cycloalkyl group having 3 to 20 carbon atoms or an aryl group having 6 to 20 carbon atoms. Specific examples thereof include distearyl pentaerythritol diphosphite; dioctyl pentaerythritol diphosphite; diphenyl pentaerythritol diphosphite; bis(2,4-di-tert-butylphenyl)pentaerythritol diphosphite; bis(2,6-di-tert-butyl-4-methylphenyl) pentaerythritol diphosphite, dicyclohexy pentaerythritol diphosphite; tris(2,4-di-tert-butylphenyl)phosphite; tetrakis (2,4-di-tert-butylphenyl)-4,4'-biphenylene phosphite. Of these are preferably usable bis(2,4-di-tert-butylphenyl) pentaerythritol diphosphite; bis(2,6-di-tert-butyl-4-methylphenyl)pentaerythrytol diphosphite; tris(2,4-tert-butylphenyl)phosphite; and tetrakis(2,4-di-tert-butylphenyl)- 4,4'-biphenylene phosphite.

There are also usable a variety of phenolic antioxidants, which are exemplified by dialkylphenol, trialkylphenol, diphenylmonoalkoxyphenol and tetraalkylphenol.

Examples of dialkylphenol include 2,2'-methylenebis(6-tert-butyl-4-methylphenol); 1,1-bis(5-tert-butyl-4-hydroxy-2-methylphenyl)butane; 2,2'-methylenebis(4-methyl-6-cyclohexylphenol); 4,4'-thiobis(6-tert-butyl-3-methylphenol); and 2,2-bis(5-tert-butyl-4-hydroxy-2-methylphenol)-4-n-dodecylmercapto-butane. Examples of trialkylphenol include 2,6-di-tert-4-methylphenol; 2,2'-methylenebis(6-tert-butyl-4-ethylphenol); 2,2'-methylene-bis[4-methyl-6-(α-methylcyclohexyl)phenol]; 2,2'-methylenebis(4-methyl-6-nonylphenol); 1,1,3-tris-(5-tert-butyl-4-hydroxy-2-methylphenyl)butane; ethyleneglycol-bis[3,3-bis(3-tert-butyl-4-hydroxyphenyl)butyrate]; 1-1-bis (3,5-dimethyl-2-hydroxyphenyl)-3-(n-dodecylthio)-butane; 1,3,5-tris(3,5-di-tert-butyl-4-hydroxybenzyl)-2,4,6-trimetylbenzene; 2,2-bis(3,5-di-tert-butyl-4-hydroxybenzyl) dioctadecyl malonate ester; n-octadecyl-3-(4-hydroxy-3,5-di-tert-butylphenyl)propionate; tetrakis[methylene(3,5-di-tert-butyl-4-hydroxyhydrocinnamate)]methane; 3,9-bis[1,1-dimetyl-2-(β-(3-tert-butyl-4-hydroxy-5-methylphenyl) propionyloxy)ethyl-2,4,8,10-tetroxaspiro[5,5]undecane; and tris-(3,5-di-tert-butyl-4-hydroxylenzyl)isocyanurate. Examples of diphenylmonoalkoxyphenol include 2,6-diphenyl-4-methoxyphenol. Examples of tetraalkylphenol include tris-(4-tert-butyl- 2,6-di-methyl-3-hydroxybenzyl)-isocyanurate.

The sulfur-based antioxidant is preferably thioether-based, and is specifically exemplified by dilauryl-3,3'-thiodipropionate; dimyristyl-3,3'-thiodipropionate; distearyl-3,3'-thiodipropionate; pentaerythritol-tetrakis-(β-lauryl-thiopropionate); bis[2-methyl-4-(3-n-alkylthiopropionyloxy)-5-tert-butylphenyl]sulfide; and 2-mercaptobenzimidazole. Of these pentaerythritol-tetrakis-(β-lauryl-thiopropionate) is particularly preferable.

The styrenic resin composition according to the present invention can be produced by an arbitrary method, that is, any of the various methods that are used for the conventional thermoplastic resins. Applicable production methods include, for example, a method in which the components (A) and (B) are mixed and melt kneaded by means of an extruder or the like, a method in which the component (B) is added in any stage of the extrusion step of the component (A), a method in which the component (B) is added in any stage of the production step of the component (A) and a method in which a mixture of the components (A) and (B) along with the component (A) are melt kneaded.

A molded article formed by the use of the styrenic resin composition of the present invention exhibits excellent effect irrespective of its form or shape, and the composition is applied, for example, to films, sheets, fibers, yarns, pipes, trays, three-dimensional molded articles to be formed by injection molding and the like.

In the case of producing a sheet by the use of the styrenic resin composition of the present invention, conventional extrusion molding, press molding or the like may be applied to the production. A suitable temperature of heat melting in the above case ranges from 270 to 350° C. In addition, the sheet thus obtained may be subjected to a heat treatment at a temperature between the glass transition temperature and the melting point.

Likewise, in the case of producing, for example, a film by using the styrenic resin composition of the present invention the production method is not specifically limited. The objective film is obtained by heat melting the raw material, then making a preform, heat orientating the resultant preform and when necessary, heat treating the orientated film.

The procedures from the above-mentioned heat melting to heat setting will be specifically explained in the following. Firstly, the styrenic polymer thus obtained as the raw material for molding is usually extrusion molded to form a preform for orientation (film, sheet or tube). In this molding, the heat-melted raw material for molding is generally molded to a prescribed shape by means of an extruder, but the raw material for molding may be molded in a softened state without being heat melted. The extruder to be employed may be any of a single screw extruder and a twin screw extruder each with or without a vent. The use of a proper mesh in an extruder enables the removal of unexpected impurities and foreign matters. The mesh may suitably be selected in the form of flat plate, cylinder or the like. The extrusion condition is not specifically limited but may be suitably selected according to the various situations. The preferable extrusion conditions however, include an extrusion temperature ranging from the melting point of the raw material to the temperature 50° C. higher than the degradation temperature of the same and a shear stress of $5 \times 10^6$ dyne/cm$^2$ or less. As a die to be used, mention may be made of a T-die, torus die and the like.

After the above-mentioned extrusion molding, the preform for orientation thus obtained is cooled for solidification by the use of a refrigerant such as gas, liquid, metallic roll or the like. In the case where a metallic roll is used, the application of an air knife, air chamber, touch roll or electrostatic charging is effective in preventing unevenness in thickness and waviness of the film.

The cooling solidification is carried out usually at a temperature ranging from 0° C. to the temperature 30° C. higher than the glass transition temperature of the preform for orientation, preferably ranging from the temperature 70° C. lower than the above glass transition temperature to the above glass transition temperature. The cooling rate is usually selected in the range of 200 to 3° C. per second.

In the case where the cooled and solidified preform is biaxially oriented to form films, the biaxial orientation may be carried out simultaneously in the machine and transverse directions or successively in the optional order, and may be effected in single stage or multi-stage. The draw ratio in terms of area ratio is 2 or more, preferably 3 or more. The draw ratio in the above range can produce the film having favorable physical properties such as a crystallinity of 25% or higher.

There are available a variety of orientation methods, which include the method by a tenter, roll-orientation method, bubbling method by the use of pneumatic pressure, rolling method, etc., each of which may be suitably selected or combined with another. The orientation temperature may be usually set in the range of the glass transition temperature of the preform to the melting point thereof. The orientation rate is generally $1 \times 10$ to $1 \times 10^5 \%$ per minute, preferably $1 \times 10^3 \%$ to $1 \times 10^5 \%$ per minute. The oriented film obtained under the foregoing conditions is preferably subjected to heat setting when dimensional stability at a elevated temperature, heat resistance or balanced strength inside the film is required according to the purpose of use. The heat setting may be performed by the conventional method, for example, by a method wherein the oriented film is maintained for 0.5 to 120 seconds at a temperature ranging from the glass transition temperature of the film to the melting point thereof, preferably ranging from the temperature 100° C. lower than the melting point thereof to the temperature slightly lower than the melting point thereof under the condition of tension, non-tension or limited contraction. In addition, the heat setting can be carried out twice or more under different conditions within the above-described ranges, and may be effected in an atmosphere of an inert gas such as argon gas, nitrogen gas, or the like.

In the following, the present invention will be described in more detail with reference to working examples.

REFERENCE EXAMPLE 1

In a 500 milliliter (hereinafter abbreviated to mL) glass vessel which had been purged with argon were placed 17 g (71 mmol) of copper sulfate pentahydrate ($CuSO_4 \cdot 5H_2O$), 200 mL of toluene and 24 mL (250 mmol) of trimethylaluminum, which were then reacted at 40° C. for 8 hours. Subsequently, the solids were separated from the reaction mixture to obtain 6.7 g of a contact product. The molecular weight thereof as determined by the freezing point depression method was 610.

PREPARATION EXAMPLE 1

(Preparation of styrenic polymer having a syndiotactic configuration)

In a 2 liter (hereinafter abbreviated to "L") reaction vessel were placed the contact product as obtained in the above Reference Example 1 in an amount of 7.5 mmol as aluminum atom, 7.5 mmol of triisobutylaluminum, 0.038 mmol of pentamethylcyclopentadienyltitanium trimethoxide and 1 L of purified styrene, which were then subjected to polymerization reaction at 90° C. for 5 hours. After the completion of the reaction, the catalytic components were decomposed with a solution of sodium hydroxide in methanol and then the reaction product was washed with methanol repeatedly and dried to afford 466 g of polymer. As the result of analysis by gel permeation chromatography using 1,2,4-trichlorobenzene at 130° C. as the solvent, the polymer thus produced had a weight-average molecular weight of 290,000 and a ratio of weight-average molecular weight to number-average molecular weight of 2.72.

It was confirmed that the polymer thus obtained was polystyrene having a syndiotactic configuration from the results of melting point measurement and $^{13}C$-NMR analysis using carbon isotope.

EXAMPLE 1

N,N'-hexamethylenebis(3,5-di-tert-butyl-4-hydroxyhydrocinnamide) in an amount of 1.0% by weight was mixed with 99.0% by weight of the styrenic polymer having the syndiotactic configuration which was produced in Preparation Example 1. The resultant mixture was melt extruded at 300° C. by means of an extruder equipped with a T-die at the end thereof and thereafter, cooled to form preforms having a low crystallinity and thicknesses of 300 $\mu$m and 60 $\mu$m, respectively. The preforms thus formed were heat-treated at 180° C. for 1 minute for produce sheets. The preform of 60 $\mu$m in thickness was biaxially oriented in machine and transverse directions each at a draw ratio of 3 at 110° C., followed by a heat treatment at 260° C. for 20 seconds to prepare film. The sheet and film thus obtained were measured for the dielectric breakdown voltage by direct current. The results are given in Table 1, showing 195 kV/mm and 550 kV/mm, respectively.

EXAMPLES 2 to 5

The procedure in Example 1 was repeated to prepare a sheet and/or film and measure the dielectric breakdown voltage except that the types of organic compounds and amounts thereof added to the polymer were altered as indicated in Table 1. The results are given in Table 1.

EXAMPLE 6

The procedure in Example 1 was repeated to prepare a film and measure the dielectric breakdown voltage except that there was used the composition further comprising 5% by weight of a polyphenylene ether in addition to the composition which was used in Example 5. The results are given in Table 1.

COMPARATIVE EXAMPLE 1

The procedure in Example 1 was repeated to prepare a sheet and film and measure the dielectric breakdown voltage except that the use of N,N'-hexamethylenebis(3,5-di-tert-butyl-4-hydroxy-hydrocinnamide) was omitted. The results are given in Table 1.

COMPARATIVE EXAMPLE 2 TO 5

The procedure in Example 1 was repeated to prepare a sheet and/or film and measure the dielectric breakdown voltage except that the types of organic compounds and amounts thereof added to the polymer were altered as indicated in Table 1. The results are given in Table 1.

TABLE 1

| | Organic compound | | | Amount added |
|---|---|---|---|---|
| | Type | —NH— | Group adjacent to —NH— | (wt. %) |
| Example 1 | A | YES | carbonyl | 1.0 |
| Example 2 | A | YES | carbonyl | 0.3 |
| Example 3 | A | YES | carbonyl | 2.0 |
| Example 4 | B | YES | phenyl, triazine | 1.0 |
| Example 5 | C | YES | carbonyl | 1.0 |
| Example 6 | C | YES | carbonyl | 1.0 |
| Example 7 | D | YES | carbonyl | 1.0 |
| Example 8 | E | YES | phenyl, naphthyl | 1.0 |
| Comp. Example 1 | — | — | — | 0.0 |
| Comp. Example 2 | F | No (phenolic antioxidant) | | 1.0 |
| Comp. Example 3 | G | No (phenolic antioxidant) | | 1.0 |
| Comp. Example 4 | H | No (sulfur-based antioxidant) | | 1.0 |
| Comp. Example 5 | I | No (phosphorus-based antioxidant) | | 1.0 |

| | Molded Article | Thickness ($\mu$m) | Dielectric Breakdown Voltage (kV/mm) |
|---|---|---|---|
| Example 1 | Sheet | 300 | 195 |
| | Film | 6 | 550 |
| Example 2 | Film | 6 | 480 |
| Example 3 | Film | 6 | 580 |
| Example 4 | Sheet | 300 | 190 |
| | Film | 6 | 530 |
| Example 5 | Sheet | 300 | 205 |

TABLE 1-continued

|  |  |  |  |
|---|---|---|---|
| Example 6 | Film | 6 | 490 |
| Example 7 | Film | 6 | 510 |
| Example 8 | Film | 6 | 500 |
|  | Film | 6 | 490 |
| Comp. Example 1 | Sheet | 300 | 130 |
|  | Film | 6 | 330 |
| Comp. Example 2 | Sheet | 300 | 150 |
|  | Film | 6 | 400 |
| Comp. Example 3 | Film | 6 | 410 |
| Comp. Example 4 | Film | 6 | 410 |
| Comp. Example 5 | Film | 6 | 410 |

*Comp. means "Comparative"

Remarks
A: N,N'-hexamethylenebis(3,5-di—tert—butyl-4-hydroxy—hydrocinnamide)
B: 2,4-bis-(n-octylthio)-6-(4-hydroxy-3,5-di—tert—butylanilino)-1,3,5-triazine
C: N,N'-bis[3-(3,5-di—tert—butyl—hydroxyphenyl)propinyl]hydrazine
D: 2-pheoxypropionylhydrazide isophthalate
E: N,N-di-2-naphthyl—p—phenylenediamine
F: pentaerythrityl—tetrakis[3-(3,5-di—tert—butyl-4-hydroxyphenyl)propionate
G: tris(3,5-di—tert—butyl-4-hydroxybenzyl)-isocyanurate
H: 2,2-thio—diethylenebis[3-(3,5-di—tert—butyl-4-hydroxyphenyl)propionate
I: bis(2,6-di—tert—butyl-4-methylphenyl)pentaerythritol diphosphite

INDUSTRIAL APPLICABILITY

As described in detail hereinbefore, there is obtained, according to the present invention, a styrenic resin composition which is improved in electrically insulating properties, especially in withstand voltage against direct current. Accordingly, the styrenic resin composition according to the present invention can favorably be employed for electronic machinery parts, printed circuit board, insulating self-adhesive tape, capacitor, insulating film, FPC and the like.

We claim:

1. An electric component comprising an electric conductor insulated with electric insulation material having improved resistance to dielectric breakdown voltage by direct current, said electric composition comprising a styrenic resin composition which comprises 70 to 99.9% by weight of an (A) styrenic polymer having a high degree of syndiotactic configuration and 0.1 to 30% by weight of a (B) organic compound having a —NH— group, a molecular weight of less than 10,000 and a thermal decomposition temperature of 270° C. or higher.

2. The electric component according to claim 1 wherein said organic compound as the component (B) has an electron-attracting group adjacent to said —NH— group.

3. The electric component according to claim 2 wherein said electron-attracting group contains a carbonyl group or an aromatic ring.

4. The electric component according to claim 1 wherein said composition comprises 80 to 99.9% by weight of said styrenic polymer as the component (A) and 0.1 to 20% by weight of said organic compound as the component (B).

5. The electric component according to claim 1 wherein said composition comprises 90 to 99.9% by weight of said styrenic polymer as the component (A) and 0.1 to 10% by weight of said organic compound as the component (B).

6. The electric component according to claim 1 wherein said organic compound as the component (B) is at least one compound selected from the group consisting of 2,4-bis(n-octylthio)-6-(4-hydroxy-3,5-di-tert-butylanilino)-1,3,5-triazine; N,N'-hexamethylenebis(3,5-di-tert-butyl-4-hydroxy-hydrocinnamide); N,N'-bis[3-(3,5-di-tert-butyl-hydroxyphenyl)propionyl]hydrazine; 2-phenoxypropionylhydrazide isophthalate; and N,N'-di-2-naphthyl-p-phenylenediamine.

7. The electric component according to claim 1 wherein the electric insulation material is in the form of a sheet of film.

8. The electric component according to claim 1 wherein the Dielectric Breakdown DC-voltage of the electric insulation material is 480 Kv/min or more in the form of a film.

9. The electric component according to claim 1, wherein said organic compound (B) is at least one compound selected from the group consisting of 2,4-bis(n-octylthio)-6-(4-hydroxy-3,5-di-tert-butylanilino)-1,3,5-triazine; N,N'-hexamethylenebis(3,5-di-tert-butyl-4-hydroxy-hydrocinnamide); N,N'-bis[3-(3,5-di-tert-butyl-hydroxyphenyl)propionyl]hydrazine; 3-(N-salicyloyl)amino-1,2,4-triazole; disalicyloylhydrazide decamethylenedicarboxylate; 2-phenoxypropionylhydrazide isophthalate; oxalyl-bis(benzylidene-hydrazide); N-formyl-N'-salicyloylhydrazine; N,N'-di-2-naphthyl-p-phenylenediamine; and 4,4'-bis(α,α'-dimethylbenzyl)diphenylamine.

10. The electric component according to claim 9 wherein the electric insulation material is in the form of a sheet of film.

11. The electric component according to claim 9 wherein the Dielectric Breakdown DC-voltage of the electric insulation material is 480 Kv/mm or more in the form of a film.

* * * * *